United States Patent
Cheng et al.

(10) Patent No.: US 8,278,175 B2
(45) Date of Patent: Oct. 2, 2012

(54) COMPRESSIVELY STRESSED FET DEVICE STRUCTURES

(75) Inventors: Kangguo Cheng, Guilderland, NY (US); Bruce B. Doris, Slingerlands, NY (US); Ali Khakifirooz, Slingerlands, NY (US); Pranita Kulkarni, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 12/813,311

(22) Filed: Jun. 10, 2010

(65) Prior Publication Data
US 2011/0303915 A1 Dec. 15, 2011

(51) Int. Cl.
*H01L 21/335* (2006.01)
(52) U.S. Cl. .................. 438/294; 438/770; 257/E21.283
(58) Field of Classification Search .................. 438/294, 438/770; 257/E21.283
See application file for complete search history.

(56) References Cited

U.S. PATENT DOCUMENTS

| 7,602,021 | B2 | 10/2009 | Doris ........................... 257/347 |
| 7,977,174 | B2 * | 7/2011 | Luning et al. .................. 438/157 |
| 2008/0020531 | A1 | 1/2008 | Williams ....................... 438/283 |
| 2009/0206407 | A1 | 8/2009 | Anderson ....................... 257/365 |
| 2009/0294840 | A1 | 12/2009 | Gilgen .......................... 257/327 |

* cited by examiner

*Primary Examiner* — Wensing Kuo
(74) *Attorney, Agent, or Firm* — George Sai-Halasz; Louis J. Percello

(57) ABSTRACT

Methods for fabricating FET device structures are disclosed. The methods include receiving a fin of a Si based material, and converting a region of the fin into an oxide element. The oxide element exerts pressure onto the fin where a Fin-FET device is fabricated. The exerted pressure induces compressive stress in the device channel of the Fin-FET device. The methods also include receiving a rectangular member of a Si based material and converting a region of the member into an oxide element. The methods further include patterning the member that N fins are formed in parallel, while being abutted by the oxide element, which exerts pressure onto the N fins. Fin-FET devices are fabricated in the compressed fins, which results in compressively stressed device channels. FET devices structures are also disclosed. An FET devices structure has a Fin-FET device with a fin of a Si based material. An oxide element is abutting the fin and exerts pressure onto the fin. The Fin-FET device channel is compressively stressed due to the pressure on the fin. A further FET device structure has Fin-FET devices in a row each having fins. An oxide element extending perpendicularly to the row of fins is abutting the fins and exerts pressure onto the fins. Device channels of the Fin-FET devices are compressively stressed due to the pressure on the fins.

8 Claims, 4 Drawing Sheets

COMPRESSIVELY STRESSED FET DEVICE STRUCTURES

BACKGROUND

The present invention relates to electronic devices of very large scale integration (VLSI) circuits. In particular, it relates to Fin type FET devices.

As FET (Field-Effect-Transistor) devices are being scaled down, the technology becomes more complex, and changes in device structures and new fabrication methods are needed to maintain the expected performance improvements from one successive device generation to the next. Fin-FET or Tri-Gate devices offer possible avenues to continue on the path of miniaturization.

BRIEF SUMMARY

A method for fabricating an FET device structure is disclosed. The method includes receiving a fin of a silicon (Si) based material, and converting a first region of the fin into an oxide element. The oxide element exerts pressure onto a second region of the fin where a Fin-FET device is fabricated. The pressure induces compressive stress in the device channel of the Fin-FET device.

A method for fabricating an FET device structure is disclosed. The method includes receiving a rectangular member of a Si based material, and converting a region of the member into an oxide element. The method further includes patterning the member in such manner that at least two fins are formed side by side, while being abutted by the oxide element, which exerts pressure onto the fins. Fin-FET devices are fabricated in the compressed fins, which results in compressively stressed device channels.

An FET device structure is disclosed which has a Fin-FET device with a fin of a Si based material. An oxide element is abutting the fin and exerts pressure onto the fin. The Fin-FET device channel is compressively stressed due to the pressure on the fin.

An FET device structure is disclosed which has at least two Fin-FET devices in a row having fins. An oxide element extending perpendicularly to the row of fins is abutting the fins and exerts pressure onto the fins. Device channels of the Fin-FET devices are compressively stressed due to the pressure on the fins.

BRIEF DESCRIPTION OF THE SEVERAL VIEWS OF THE DRAWINGS

These and other features of the present invention will become apparent from the accompanying detailed description and drawings, wherein:

FIG. 1 symbolically shows a semiconductor fin at a commencing stage of the processing for an embodiment of the disclosure;

FIG. 2 symbolically shows regions and masking of a semiconductor fin in an embodiment of the disclosure;

FIG. 3 symbolically shows converting to oxide regions of the fin;

FIG. 4 symbolically shows a further stage in processing;

FIG. 5 symbolically shows a stressed FET device structure in an embodiment of the disclosure;

FIG. 6 symbolically shows a semiconductor member, at a commencing stage of the processing for an embodiment of the disclosure;

FIG. 7 symbolically shows regions and masking of a semiconductor member in an embodiment of the disclosure;

FIG. 8 symbolically shows oxide elements in the semiconductor member at a further stage in processing;

FIG. 9 symbolically shows the state of processing after patterning the semiconductor member; and FIG. 10 symbolically shows a stressed FET device structure in an embodiment of the disclosure.

DETAILED DESCRIPTION

It is understood that Field Effect Transistor-s (FET) are well known in the electronic arts. Standard components of an FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator, or gate dielectric. Depending whether the "on state" current in the channel is carried by electrons or by holes, the FET comes in two types: as NFET or PFET. (In different nomenclature the NFET and PFET devices are often referred to as NMOS and PMOS devices.)

A Fin-FET, or Tri-Gate, device is an FET device but with a particular geometric configuration. These devices are non-planar, they are three dimensional structures hosted by a fin structure. In Fin-FETs, the body of the transistor is formed in a fin rising out of a planar background, typically having both vertical and horizontal surfaces. The gate of the Fin-FET may engage the top surface, as well as the vertically oriented body surfaces on both faces, or sidewalls, resulting in several planes being used for transistor channel formation. Such FET devices, with fin-type bodies, have several advantages as known in the art. In embodiments of the present invention, the dimensions of fin structures that serve as fin-type device bodies may be of a height of about 5 nm to 50 nm, and of a width of between 3 nm to about 30 nm.

There is great difficulty in maintaining performance improvements in devices of deeply submicron generations. One general approach for improving performance is to try to increase carrier (electron and/or hole) mobilities. A promising avenue toward better carrier mobility is to apply tensile or compressive stress in the semiconductor channel regions. Typically, it may be preferable to have the channel of electron conduction type devices, such as NFET, in tensile stress, while to have the channel of hole conduction type devices, such as PFET, in compressive stress.

Methods that are used to apply stress to planar devices, such as stress liners, may be less effective in three dimensional (3D) FETs, such as a Fin-FET, or Tri-Gate devices. Embodiments of the present invention apply compressive stress to Fin-FET device channels, which then may be suitable for PFET application. In embodiments of the invention one may take advantage of the fact that when silicon is thermally oxidized a volume expansion is taking place. The resulting oxide ($SiO_2$) volume is close to twice that of the Si which has not been oxidized. If the Si which is turned into oxide occupied a confined, or partially confined, place the resulting oxide would exert significant pressure onto the confining elements that resist its expansion. In representative embodiments of the invention compressive stress in Fin-FET channels is achieved using such oxide induced pressure. Typically, attaining such compressive stress in Fin-FET channels does not require extra masking steps in comparison to a standard fabrication process resulting in no stressed device channels.

FIG. 1 symbolically shows a semiconductor fin, at a commencing stage of the processing of an embodiment of the invention. Such an embodiment may include a method for fabricating an FET device structure having Fin-FET devices, and may include the structure itself. This initial stage is that of receiving a semiconductor fin 20 which is of a silicon based material. The term of receiving is intended to be inclusive of any possible manner by which one may arrive at this initial stage of the embodiment. The processing may have just reached this stage of fabrication, or the fin 20 may have been supplied by some source. The material of the semiconductor fin 20 is a Si based material, which may be essentially pure silicon (Si), but may also be a silicon-germanium (SiGe) alloy, typically with less than 30% Ge content, or Si with carbon Si:C, typically with less than 5% C content. The fin material in representative embodiments of the invention is in single-crystal form.

In typical embodiments of the instant invention the fin 20 is supported by a platform 10, which maybe be a buried oxide layer (BOX). Such BOX layer is typical in the art, but embodiments of the present invention do not depend on the platform 10 being a BOX layer. The platform 10 supporting the fin 20 could be of differing insulators, semiconductors, possibly of metallic substances, or any other known one for such purposes without limitation. The structures shown in the figures usually are part of a larger integrated circuit (IC) on a chip. The drawings typically may only depict a small fraction of a circuit, or even a small fraction of a single device structure.

Figure 1:
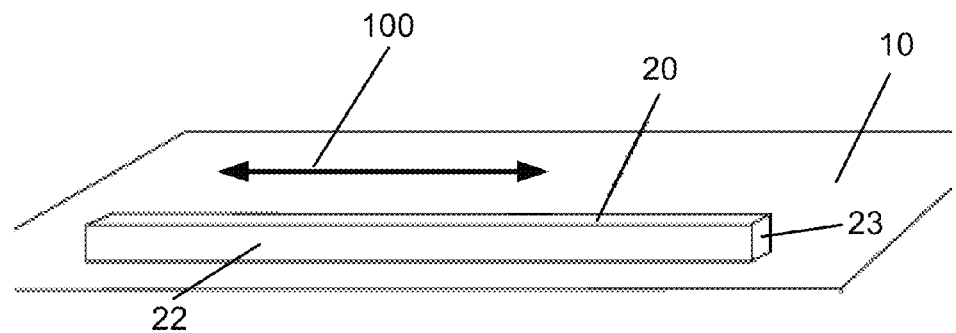

The fin 20 naturally defines a length direction, indicated in FIG. 1 with the two sided arrow 100. The fin 20 lies along an essentially straight line which is in the length direction. The fin 20 has sidewalls 22 running along the length direction, which sidewalls are typically free standing. The fin also has an ending cross section 23, which is typically perpendicular to the length direction.

Manufacturing of NFET, PFET, and Fin-FET devices is established in the art. It is understood that there are large number of steps involved in such processing, and each step may have practically endless variations, known to those skilled in the art. For embodiments of this disclosure it is understood that the whole range of known processing techniques are available for fabricating the devices, and only those process steps will be detailed that are related to the embodiments of the present invention.

Figure 2:
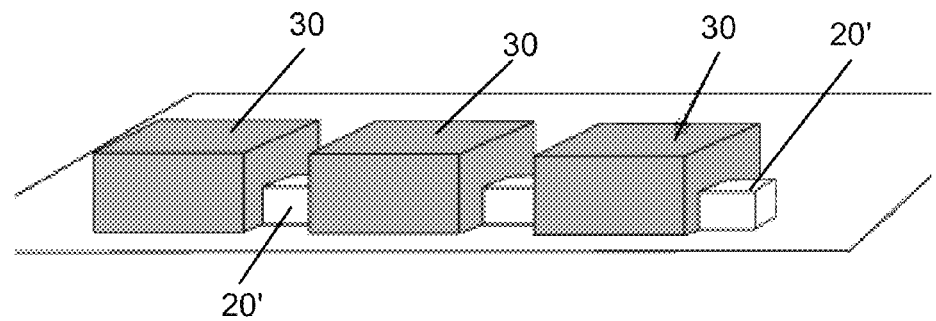
Figure 3:
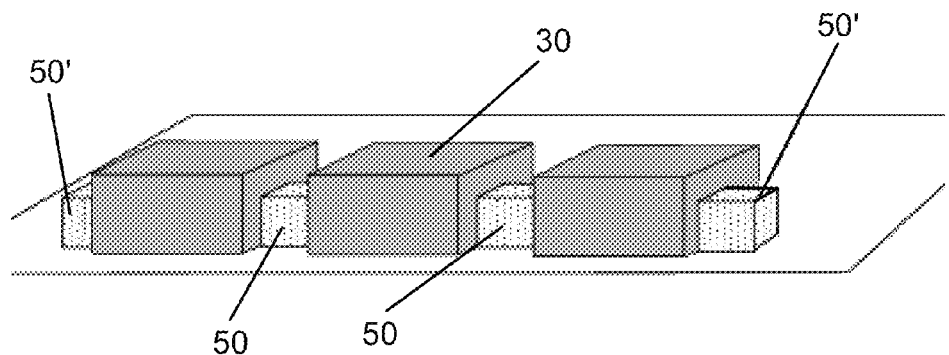
Figure 4:
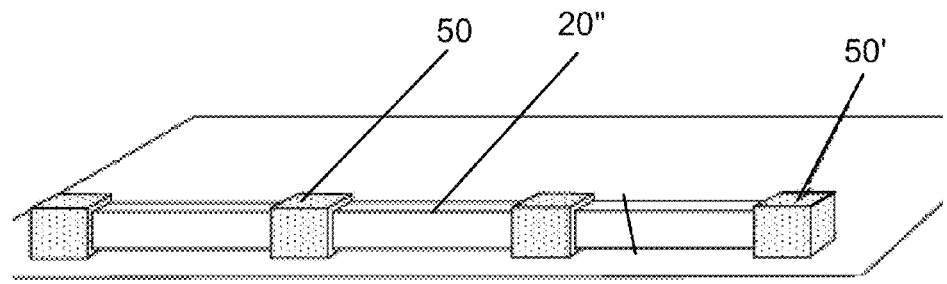
Figure 5:
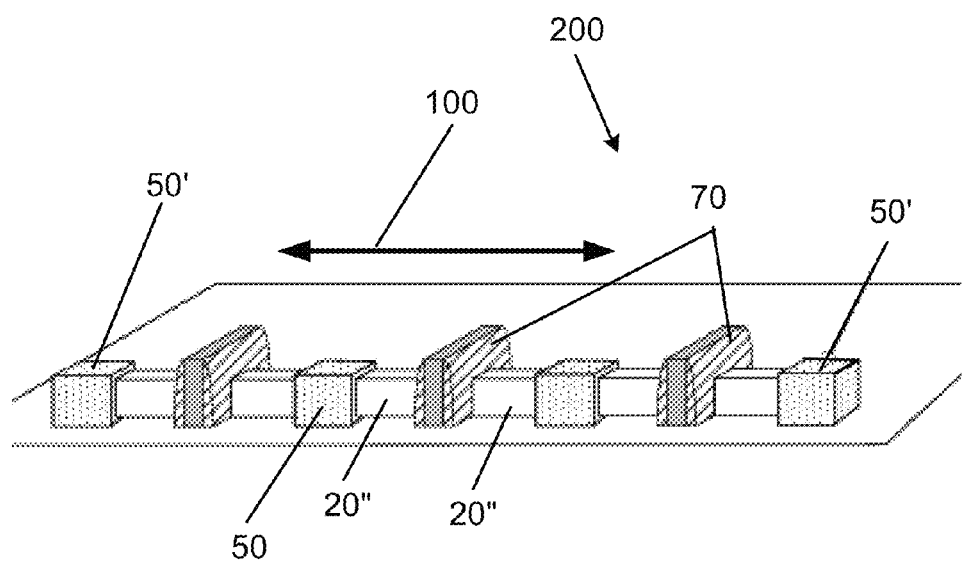

FIGS. 2 to 4 show, without intent of limiting, a fabrication path from the fin 20 of FIG. 1 toward a representative structure of an embodiment of the invention depicted in FIG. 5. FIG. 2 symbolically shows respective regions and masking of the semiconductor fin, depicting a stage in the process which defines first and second regions along the fin. A hardmask 30, such as silicon nitride for example, is deposited and patterned, as it would normally be used to define the active region of the individual fins. For an embodiment of the present invention, the hardmask 30 is instrumental in defining two adjoining regions of the fin in the length direction a first region 20' and a second region which is the part of the fin 20 beneath the mask 30. The indicator number 20' implies that at this point the first region is a portion of the fin itself.

FIG. 3 symbolically shows a stage in the fabrication following the conversion of the first regions 20' into oxide elements 50, 50'. The exposed first regions are oxidized in manners known in the art, by dry or wet thermal oxidation. To promote oxidation, one may implant species known to have oxidation enhancing effects, such as fluorine (F), or amorphize the first regions prior to oxidation. In typical embodiments of the invention the whole of the semiconductor material of the first regions is converted into oxide, typically $SiO_2$. If the first regions 20' are alloyed, such as with Ge or C, naturally the composition of the oxide element 50 would reflect the alloying.

FIG. 4 symbolically shows a stage in the fabrication following removal of the mask 30, hence the second region 20" is now visible. At this point in the fabrication the second region is a portion of the originally received fin 20. The oxide element 50 exerts pressure onto the second region 20". This pressure is due, as discussed earlier, to the fact that oxidation of silicon results in a large volume increase. The volume of the oxide element is about twice that of the material originally in the first portion 20'. The pressure in the length direction results in a compressive stress on the second portion 20" in the length direction.

FIG. 4 shows an alternating sequence of oxide elements 50 and second regions 20" along the length direction. Embodiments of the present invention are not restricted to a plurality of these elements. One single fin region 20" adjoining one single oxide element 50 is included in embodiments of the present invention. One oxide element 50, which turned into oxide when a first region 20' adjoining the second region 20" is converted into oxide, is already exerting longitudinal pressure onto a region which is adjoining it. At the same time, a case with hundreds or more, of oxide elements 50 and second regions 20" in alternating sequence along the length direction is also included amongst embodiments of the present invention. In a typical embodiment of the invention an end portion if the fin is defined to be a first region, and hence converted into oxide 50'. The notation of 50' indicates that the ending oxide element is and oxide element 50, but in a selected location, namely at the end of the alternating sequence, and it has only a single adjoining second region 20". Usually the alternating sequence has oxide elements 50' at both of its ends.

FIG. 5 symbolically shows a stressed FET device structure 200 in an embodiment of the disclosure. The fabrication follows the state shown in FIG. 4, by processing Fin-FET devices 70 in the second regions 20". Consequently, after the completion of the Fin-FET devices, the second regions 20" of the starting fin 20 now are the fins of the individual Fin-FET devices 70. The fabrication of the Fin-FET devices 70 may proceed along known lines in the art.

The Fin-FET devices, as displayed in FIG. 5, as well as all Fin-FET devices in embodiments of the present disclosure may be any kind of Fin-FET devices, fabricated in any manner. They may be, for example, and without intent of limiting, oxide dielectric or high-k dielectric devices, they may be polysilicon gate or metal gate devices, or of any further kind The fabrication may have so called gate first, or gate last, variations, or further kinds. Accordingly, the Fin-FET 70 devices shown in the figures may be regarded as representative embodiments of Fin-FET devices in general.

The fins 20" of the Fin-FET device 70 have ending cross sections, where the oxide elements 50, 50' are exerting pressure onto the fins in the length direction. The result is that this pressure on the fins 20" is transferring to the Fin-FET device 70 channel, which becomes compressively stressed.

Compressive stress in the device channel is desired in PFET devices, because the compressive stress increases the p-type carrier, the hole, mobility. Accordingly, in typical embodiments of the present invention, an FET device structure 200 containing the oxide elements and the Fin-FET devices, are such that the Fin-FET devices have been processed to become PFET devices. Consequently, the FET device structure 200 is a PFET device structure.

In the same manner as with reference to FIG. 4, FIG. 5 also shows an alternating sequence of oxide elements 50, 50' and Fin-FET devices 70 along the length direction. However, embodiments of the present invention are not restricted to a plurality of these elements. One single Fin-FET device 70 having its fin's ending cross section abutted from one side by one oxide element 50, 50' which is pressing in the length direction, is an embodiment of the present invention. If one oxide element 50, or 50' if it is an end portion, pressuring on a fin 20" which fin may contain several Fin-FET devices 70 lined up along the length direction, and without further oxide elements 50 between them, is also an embodiment of the present invention.

In an FET device structure 200 of an embodiment of the invention, the pressure that the oxide elements 50 are exerting may have measures, or characteristics, that are indicative in regard to the origin of the oxide elements. Namely, that the oxide elements 50 have been created by converting a portion of the fin 20, the first regions 20', into oxide. Such measure of the pressure, may simply be the magnitude of the exerted pressure. Or, a measure may be a characteristic pressure gradient over the ending cross section of the fin. A further measure may be a correlation between the dimension of the oxide element—such as cross section, length, the ratio of these two, or others—and the magnitude of the pressure. Since the volume ratio of a silicon based material and its oxide are well known, and mechanical properties, such as stiffness and elasticity moduli, of the silicon based material and its oxide are as also well know, the measures, or characteristics, of the pressure may be calculated. Such calculation may be carried out as numerical simulations to a high degree of accuracy. The measures of the pressure can also be determined experimentally, and the calculated and measured result compared. The calculation, and experiment may extend beyond the direct pressure of the oxide element, and include the magnitude of compression in the channel of the Fin-FET devices. Comparison of measured and calculated measures of the pressure and compression indicate the origin of the oxide elements.

The oxide elements 50, 50' may also show their origin through their chemical composition. Various alloying elements of Si that make up the fin 20, may then also be found in the oxide elements.

Figure 6:
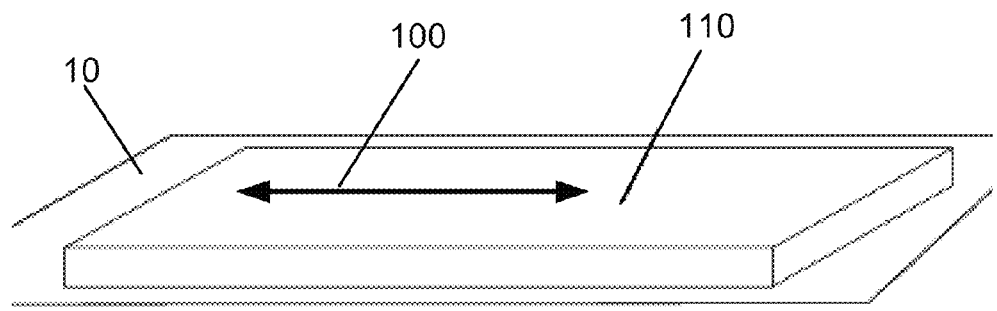

FIG. 6 symbolically shows a member 110 of a Si based material at a commencing stage of the processing of an embodiment of the invention. In this embodiment the formation of oxide elements precedes the formation of fins. The resulting FET device structure 200' is depicted in FIG. 10, FIGS. 6 to 9, without intent of limiting, show representative stages along the fabrication process. Some elements shown if FIGS. 6 to 10 are identical or similar to ones already discussed in reference to FIGS. 1 to 5. Such elements henceforth will be described only briefly, with the understanding that detailed reasoning and discussion has already been presented in reference to FIGS. 1 to 5.

The member 110 is of a silicon based material which may be essentially pure silicon (Si), but may also be a silicon-germanium (SiGe) alloy, typically with less than 30% Ge content, or Si with carbon Si:C, typically with less than 5% C content. The member 110 in representative embodiments of the invention is in single-crystal form. The member 110 has been fabricated over a platform 10. The member 110 is typically rectangular, and has a length direction and a width direction. The length direction is indicated with a two sided arrow 100.

Figure 7:
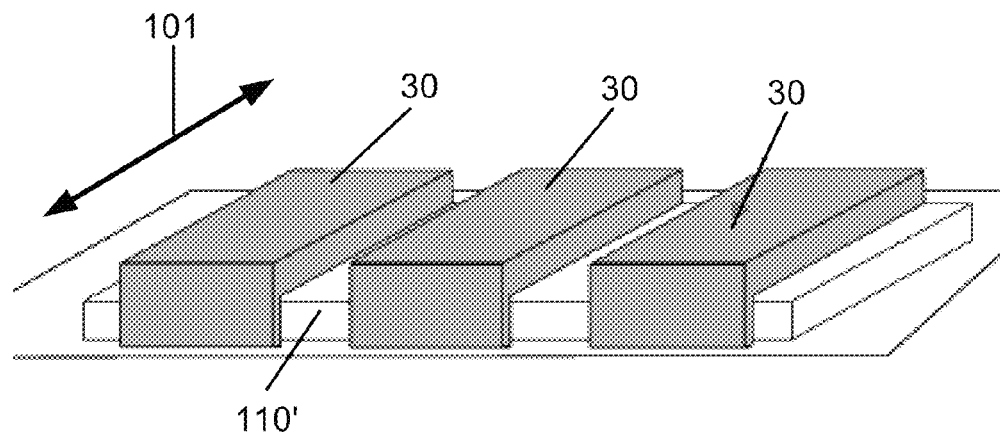

FIG. 7 symbolically shows regions and masking of the member in an embodiment of the disclosure. A hardmask 30 such as silicon nitride is deposited and patterned. The hardmask 30 is instrumental in defining a first region 110' in the member 110, which is the region not covered by the mask 30. The indicator number 110' implies that at this point the first region is a portion of the member 110 itself. The first region 110' is in parallel with a width direction and extends fully across the member 110. The width direction is indicated by the two sided arrow 101. The length direction 100 and width direction 101 are essentially perpendicular to one another.

Figure 8:
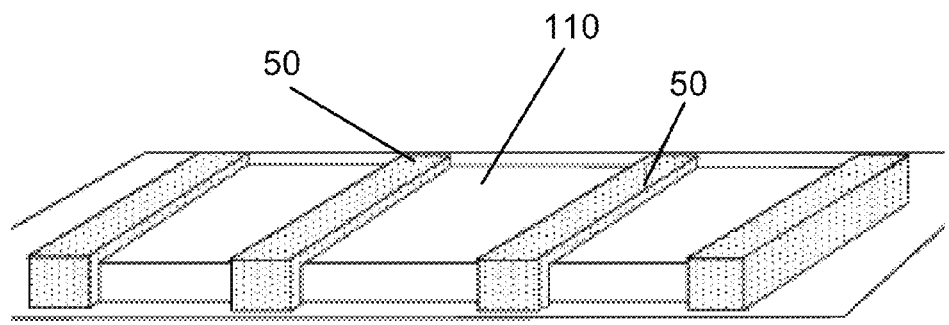

FIG. 8 symbolically shows oxide elements 50 in the semiconductor member 110 at a further stage in processing. After the state of processing shown in FIG. 4, the first region 110' is converted into an oxide element 50, by dry or wet oxidation of the material of the first region 110'. This conversion into oxide is done while mask 30 is in place, protecting the covered part of the member 110 from the oxidation. In the same manner as discussed earlier, known oxidation promoting techniques may be used to facilitate the conversion of a first region 110' into an oxide element 50.

Figure 9:
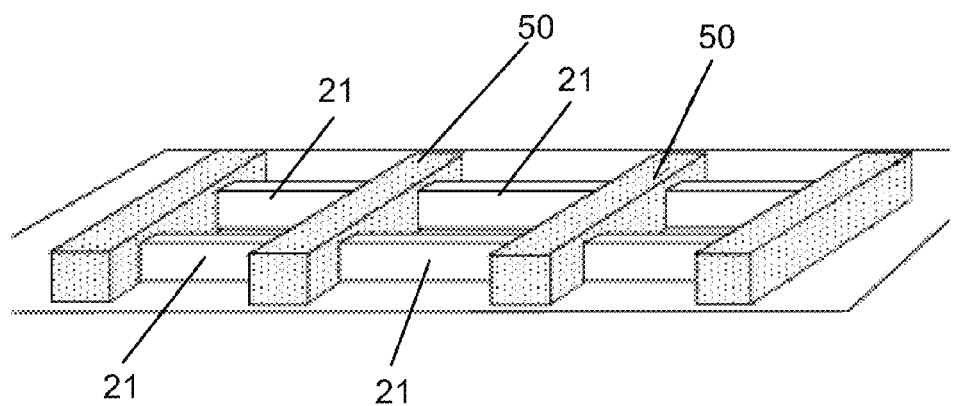
Figure 10:
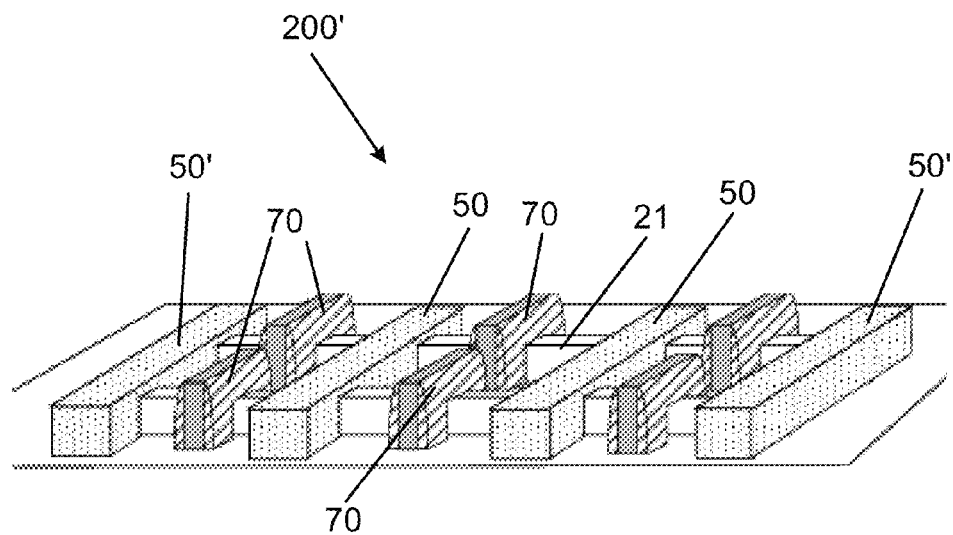

FIG. 9 symbolically shows the sate of fabrication after patterning of the semiconductor member. The term patterning customarily means, and it is used herein to mean, that in some manner, usually by lithography, a feature has been defined in a layer, typically a mask. Furthermore, by removing material according to the defined features, elements underneath the mask, in the present case the member 110, acquire a pattern. FIG. 9 shows that except for the oxide element 50, the member 110 has been patterned. The patterning was such that the remaining portion of the member forms N fins 21 in a row in parallel with the length direction 100, and spaced apart of each other in the width direction 101. In embodiments "N" is an integer number, which typically is from 2 to the hundreds or more, but being 1 is not excluded. The oxide element 50 abuts the N fins, and exerts pressure in the length direction onto the fins 21. As shown in FIGS. 9 and 10, N equals 2, since there are two fins 21 shown which are side by side in the width direction 101, and are abutted by the oxide element 50. Such a pattern in the figures is repeated several times in the length direction 100. The number of fins in each row is typically the same, but having differing numbers of fins in differing rows is not excluded.

FIG. 10 symbolically shows a stressed FET device structure 200' in an embodiment of the disclosure. The fabrication of the FET device structure follows the state shown in FIG. 9, by processing Fin-FET devices 70 in the fins 21. The processing of the Fin-FET devices 70 may proceed along known lines in the art. The FET device structure 200' has a number N of Fin-FET devices in a row having fins 21. The number "N" typically is from 2 to the hundreds or more, but being 1 is not excluded. The fins 21 have ending cross sections aligned substantially in the width direction 101. An oxide element 50, 50' extends in the width direction abutting the ending cross sections of the fins, and exerts pressure onto the fins 21 in the length direction 100. The device channels of the Fin-FET devices are compressively stressed due to the pressure exerted on the fins 21 by the oxide elements 50, 50. FIG. 10 depicts an alternating sequence in the length direction of Fin-FET devices 70 in a row with oxide elements 50, 51. The number of Fin-FET devices 70 in each row is typically the same, but having differing numbers of Fin-FET devices in differing rows is not excluded. Each oxide element exerts the pressure onto the fins in the length direction. In each row of Fin-FET devices the device channels that are compressively stressed. The alternating sequence of FIG. 10 has three Fin-FET device rows, with each row containing two Fin-FET devices. The alternating sequence has two opposite ending locations, with each being an oxide element 50'. In the same manner as discussed in reference to FIGS. 4 and 5, embodiments depicted in FIGS. 9 and 10 of the present invention are not restricted to an alternating sequence of elements. One oxide element 50 or 50' pressing from one side on one row of N fins 21, which fins 21 each may contain one Fin-FET device 70, or several Fin-FET devices 70 lined up along the length direction, and without further oxide elements 50 between them, is understood to be an embodiment of the present invention.

The pressure exerted by the oxide elements 50, 50' may have measures, or characteristics, that are indicative in regard to the origin of the oxide elements. Namely, that the oxide elements 50, 51 have been created by converting portions of the original member 110 into oxide prior to the patterning which resulted in the fins 21. The nature of the possible measures of the pressure, has already been discussed in reference to FIG. 5, which discussion also carries here to the presently discussed embodiment, in the same way as the discussion regarding the chemical composition of the oxide elements is also carried over.

As compressive stress in the device channel is desired in PFET devices, in typical embodiments of the present invention the FET device structure 200' is such that its Fin-FET devices have been processed to become PFET devices. Consequently the FET device structure 200' is a PFET device structure.

In CMOS fabrication it may be desirable that the compressive stress be contained within the PFET regions. For embodiments of instant invention this may be accomplished with a proper sequence of masking The NFET may not become oxidized because the masks 30 applied for defining oxidized regions could also cover all of the NFET regions. Alternatively, the NFET regions may become oxidized in some places, but then the stress would be removed by etching away the oxide. Such etching may be done in any step that the PFET devices are covered, for example when implanting the source/drain of the NFET devices. The NFET devices may also undergo processes to induce tensile stress in their channels, for instance with stress liners.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "upper", "side," "over", "underneath", "perpendicular", "length or width directions", etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before" or "after", does not imply or necessitate a fixed order of step sequence.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A method for fabricating an FET device structure, said method comprising:
   receiving a fin which is of a silicon based material and has a length direction which is in an essentially straight line;
   in said length direction, defining a first region and a second region of said fin, wherein said first and said second regions adjoin each other;
   converting said first region into an oxide element, whereby in said length direction pressure is exerted onto said second region;
   fabricating a Fin-FET device in said second region; and
   wherein said FET device structure comprises said Fin-FET device and said oxide element, and wherein said FET device structure is characterized as having a compressively stressed device channel.

2. The method of claim 1, further comprising:
   defining additional ones of said first region and said second region in a manner of an alternating sequence along said length direction, and converting said additional ones of said first region into additional ones of said oxide element.

3. The method of claim 1, wherein said fin has an end portion, said method further comprises defining said end portion as said first region.

4. The method of claim 1, further comprising:
   selecting said FET device structure to be a PFET device structure.

5. A method for fabricating an FET device structure, said method comprising:
   receiving a member of a Si based material, said member being rectangular and having a length direction and a width direction;
   defining a first region of said member, wherein said first region is in parallel with said width direction and extends fully across said member;
   converting said first region into an oxide element;
   wherein N is an integer number, patterning said member in such manner that a remaining portion of said member forms N fins in a row in parallel with said length direction and spaced apart of each other in said width direction while being abutted by said oxide element, wherein said oxide element exerts pressure in said length direction onto said N fins;
   fabricating Fin-FET devices in said N fins; and
   wherein said FET device structure comprises said Fin-FET devices and said oxide element, and wherein said FET device structure is characterized as having compressively stressed device channels.

6. The method of claim 5, further comprising:
   defining additional ones of said first region and converting them into additional ones of said oxide element, wherein after said patterning said additional ones of said oxide element alternate in said length direction with fins in additional ones of said row; and
   fabricating Fin-FET devices in said fins in said additional ones of said row.

7. The method of claim 5, wherein said member in said length direction has an end portion, defining said end portion as said first region and converting said first region into said oxide element.

8. The method of claim 5, further comprising:
   selecting said FET device structure to be a PFET device structure.

* * * * *